United States Patent
Dahimene et al.

(10) Patent No.: US 6,198,616 B1
(45) Date of Patent: *Mar. 6, 2001

(54) METHOD AND APPARATUS FOR SUPPLYING A CHUCKING VOLTAGE TO AN ELECTROSTATIC CHUCK WITHIN A SEMICONDUCTOR WAFER PROCESSING SYSTEM

(75) Inventors: Mahmoud Dahimene, Gaithersburg, MD (US); Richard R. Mett, Santa Clara; Siamak Salimian, Sunnyvale, both of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/054,575

(22) Filed: Apr. 3, 1998

(51) Int. Cl.[7] .................................................. H02N 13/00
(52) U.S. Cl. .............................................. 361/234; 279/128
(58) Field of Search ..................................... 361/234, 235, 361/230, 233; 279/128

(56) References Cited

U.S. PATENT DOCUMENTS

| 4,399,016 | 8/1983 | Tsukada et al. | 204/192 |
|---|---|---|---|
| 4,968,374 | 11/1990 | Tsukada et al. | 156/345 |
| 5,557,215 | * 9/1996 | Saeki et al. | 324/765 |
| 5,699,223 | * 12/1997 | Mashiro et al. | 361/234 |
| 5,708,250 | 1/1998 | Benjamin et al. | 219/121.58 |
| 5,737,175 | 4/1998 | Grosshart et al. | 361/234 |
| 5,737,177 | 4/1998 | Mett et al. | 361/234 |
| 5,812,361 | 9/1998 | Jones et al. | 361/234 |
| 5,933,314 | * 8/1999 | Lambson et al. | 361/234 |

FOREIGN PATENT DOCUMENTS

| 0 837 500 | 4/1998 | (EP) | H01L/21/68 |
|---|---|---|---|
| WO 97 37382 | 10/1997 | (WO) | H01L/21/68 |
| WO 99/00889 | 1/1999 | (WO) | H02N/13/00 |

OTHER PUBLICATIONS

Y. Ra and C–H Chen, "Direct Current Bias as an Ion Current Monitor in the Transformer Coupled Plasma Etcher", J. of Vacuum Science & Technology A(6), Nov./Dec. 1993, pp. 2911–2913.

* cited by examiner

*Primary Examiner*—Ronald W. Leja
(74) *Attorney, Agent, or Firm*—Thomason Moser Patterson; Joseph Bach

(57) ABSTRACT

A method and apparatus for retaining a substrate, such as a semiconductor wafer, upon an electrostatic chuck within a semiconductor wafer processing system. Specifically, the invention contains high voltage, DC power supply that is capable of both sourcing and sinking current at any polarity of output voltage level. This power supply is coupled to at least one electrode of an electrostatic chuck. Consequently, the power supply can be used to dynamically control the chucking voltage in response to any indicia of optimal chucking including leakage current, wafer-to-chuck potential, backside gas leakage rate, and the like.

32 Claims, 6 Drawing Sheets

METHOD AND APPARATUS FOR SUPPLYING A CHUCKING VOLTAGE TO AN ELECTROSTATIC CHUCK WITHIN A SEMICONDUCTOR WAFER PROCESSING SYSTEM

BACKGROUND OF THE DISCLOSURE

1. Field of the Invention

The present invention generally relates to a method and apparatus for retaining a workpiece within a semiconductor wafer processing system, and more particularly, to a method and apparatus for providing a chucking voltage to an electrostatic chuck such that the chuck optimally retains a semiconductor wafer.

2. Description of the Background Art

Electrostatic chucks are used for retaining a workpiece, such as a semiconductor wafer, upon a pedestal within a semiconductor wafer processing system such that the wafer can be processed. Although electrostatic chucks vary in design, they are all based upon the principle of applying a fixed voltage to one or more electrodes embedded in the chuck to establish an electric field between the chuck and the wafer. The electric field induces opposite polarity charges to accumulate on the wafer and the electrodes, respectively. The electrostatic attractive force between the oppositely polarized charges pulls the wafer toward the chuck, thereby retaining the wafer upon the chuck. In a Coulombic type chuck, the magnitude of the retention force is directly proportional to the potential difference between the wafer and the chuck electrodes. In a Johnsen-Rahbek type chuck, where the chuck material has a relatively low resistivity and charges migrate from the electrodes to the chuck surface, the magnitude of the retention force is directly proportional to the potential difference between the wafer and the chuck surface.

The chucking voltage that provides the best process results is empirically determined by processing a number of "dummy" wafers at a variety of chucking voltages. The chucking voltage that produces the best results is then repeatedly used to process wafers. During processing, each wafer is retained using the same fixed chucking voltage. Variations in the process parameters that may effect chucking force, chuck leakage current, backside gas cooling efficiency and the like are not taken into account while processing a wafer. As such, one chucking voltage is used to fit all chucking situations. As shall be discussed next, this one size fits all mentality can lead to processing anomalies, intermittent wafer sticking or substantial helium leaking.

In semiconductor wafer processing equipment, an electrostatic chuck forms a portion of a pedestal assembly. The pedestal assembly contains various components for heating or cooling the wafer, providing wafer bias, providing plasma power (cathode electrode) and routing power to the electrostatic chuck. The electrostatic chuck is used for clamping wafers to the pedestal during processing. Since the materials and processes used to process a wafer are extremely temperature sensitive, temperature control is an important aspect of wafer processing. Should the wafer material be exposed to excessive temperature fluctuations resulting from poor heat transfer during processing, performance of the wafer process may be compromised resulting in wafer damage. As such, the pedestal generally forms a heat sink or heat source as used in etching, physical vapor deposition (PVD) or chemical vapor deposition (CVD) applications. To optimally transfer heat between the wafer and pedestal, a very nearly uniform electrostatic force should be used in an attempt to cause the greatest amount of wafer surface to physically contact a support surface of the chuck and contact the surface with a uniform force.

During wafer processing, while the chucking voltage is substantially constant, the chucking force retaining a wafer varies considerably during a given process sequence or recipe. Generally, a nominal, fixed chucking voltage is applied to the chucking electrodes to provide a large nominal retention force that, as the chamber environment varies, the wafer will remain relatively stationary. Although the wafer is stationary, the heat transfer characteristics vary considerably. For example, as a process recipe is performed the chamber temperature and pressure are varied. If the voltage applied to the chucking electrode is fixed, such variations in chamber environment will cause the force retaining the wafer to fluctuate. Variability in the chucking force produces variations in the contact area between the chuck and wafer resulting in variations in the heat transfer from the wafer to the chuck as well as variations in the backside gas (e.g., helium) leak rate from beneath the wafer.

Also, chucking force variations as a wafer is being processed can cause friction between the wafer and the chuck surface that generates particulate contaminants that contaminate the backside of the wafer. Additionally, excessive chucking force can increase the time required to release the wafer after the process is complete (dechucking time). In order to minimize the dechucking time, thereby maximize throughput, it is desirable to apply the minimum chucking force required to achieve good heat transfer. To achieve maximum throughput of wafers that are all uniformly processed, it is also desirable to ensure that the chucking force used from wafer to wafer is uniform as different wafers are processed.

Wafer dechucking is generally accomplished by applying an oppositely polarized voltage compared to the chucking voltage or a similarly polarized voltage at a lesser magnitude as the chucking voltage to remove residual charges from the wafer and chuck. Such dechucking methods are well known in the art and, for example, are described in commonly assigned U.S. Pat. No. 5,459,632 issued to Birang et al. on Oct. 17, 1995. The methods used to dechuck a wafer generally apply a fixed dechucking voltage that is proportional to the magnitude of the chucking voltage. The same chucking and dechucking voltages are used for oxide wafers as well as silicon wafers or any other type of wafer. Such uniform chucking and dechucking voltages can result in wafer "sticking" after a dechucking voltage has been applied. Such sticking is especially problematic in Johnsen-Rahbek type chucks.

As mentioned above, in a Johnsen-Rahbek type chuck, the chuck body is fabricated from a relatively low resistivity material, e.g., aluminum nitride, that enables charges to migrate from the chuck electrodes to the surface of the chuck. Consequently, a small current flows through the wafer at contact points between the chuck surface and the wafer. This current flow, as expected, varies with the resistance of the wafer backside contact points to the chuck surface. As such, an oxide wafer, having a high resistivity surface, conducts very little current. While a silicon wafer, having a low resistivity surface, conducts a substantial current. If a single chucking voltage is used for all forms of wafers, some wafers (e.g., silicon wafers having a higher conductivity) would be chucked with a different force than other wafers (e.g., oxide wafers having a lower conductivity). An increase in chucking force increases the contact area between the wafer and chuck surface and results in increased leakage current flow, and vice versa for decreased chucking force. If an excessive leakage current flows through a wafer, the wafer can experience electron emission which creates a charge imbalance that is not easily removed from the chuck surface. Such an imbalance results in a residual charge remaining on the wafer after a dechucking voltage has been applied. This residual charge is the root cause of wafer "sticking". However, since various wafer types can handle various amounts of leakage current, merely limiting the chucking voltage to a value that ensures a "safe" leakage current in all wafer types results in various types of wafers being chucked with widely varying chucking forces. As such, some wafers may be inadequately chucked and other wafers may be excessively chucked.

Therefore, it is desirable to determine optimal chucking parameters for a wafer and chuck a wafer to achieve the optimal parameters by adaptively controlling the chucking voltage.

SUMMARY OF THE INVENTION

The disadvantages associated with the prior art are overcome by the invention of a method and apparatus for providing a chucking voltage to an electrostatic chuck, where the chucking voltage is responsive to indicia of optimal chucking. The indicia include an optimal leakage current and/or an optimal voltage differential between the wafer and chuck surface for the process and/or wafer type that is being processed. By providing a controlled chucking voltage, the invention controls the chucking voltage to optimize one or more process parameters such as wafer retention force, chuck leakage current, backside gas pressure, backside gas leakage rate, DC wafer bias and the like.

Specifically, the invention contains high voltage, DC power supply that is capable of both sourcing and sinking current at any polarity of output voltage. The power supply flexibly operates in three modes: 1) a fixed voltage mode wherein a set point signal controls the output voltage of the power supply to a fixed value with respect to ground; 2) a voltage tracking mode wherein the power supply produces an output voltage that achieves a constant potential difference ($\Delta V$) between the wafer and the chuck; and 3) a current tracking mode wherein the power supply produces an output current that is constant while varying the output voltage to maintain a constant chuck leakage current magnitude. Any one mode can be selected depending upon the type of wafer being processed or the type of process being performed in the chamber.

In an illustrative embodiment of the invention, the high voltage DC power supply is coupled to a pedestal assembly within a semiconductor wafer processing system that includes an electrostatic chuck supported upon a pedestal base. The pedestal assembly is also coupled to an RF power supply, a control circuit for the DC power supply, and a processing system control unit. The pedestal assembly is generally mounted in a vacuum chamber of the semiconductor wafer processing system. The electrostatic chuck conventionally comprises a dielectric chuck body having at least one chucking electrode embedded in the body. The electrostatic chuck is supported by and coupled to a pedestal base. The pedestal base generally contains heating and cooling elements, backside gas (helium) transport conduits, power cabling to the electrostatic chuck and various thermocouples, and a cathode electrode. The RF power supply is coupled to the cathode electrode.

When the power supply of the present invention is operating in the fixed voltage mode, a set point signal is supplied to power supply to indicate a particular desired output voltage with respect to ground, i.e., the chamber walls. The power supply then produces a fixed voltage that is proportional to the set point signal.

When the power supply of the present invention is operating in the voltage tracking mode to achieve a constant electrode to wafer potential difference ($\Delta V$), the electrostatic chuck power supply control circuit utilizes a signal, e.g., the peak-to-peak or peak RF voltage supplied to the cathode electrode, and computes the wafer potential $V_{dc}$ using an empirically derived transfer function. In response to the computed wafer potential, the power supply controls the chucking voltage $V_{chuck}$, i.e., the voltage to the chuck electrode, such that a constant potential difference ($\Delta V = V_{dc} - V_{chuck}$) is maintained between the wafer and the chuck electrode. The potential difference is controlled through dynamic adjustment of the output voltage from the DC power supply. The peak-to-peak voltage of the RF signal coupled to the pedestal base is an illustrative signal that is indicative of wafer potential. This signal is applied to the power supply and compared to a set point signal that indicates the desired potential difference for the particular process then occurring in the chamber. The comparison results in a difference signal that is used by the power supply to adjust the chucking voltage to attempt to maintain a constant force upon the wafer.

When the power supply is operating in the current tracking mode, a set point signal establishes a leakage current independent of the particular wafer type and process being performed in the chamber. The output current is monitored and the power supply chucking voltage is altered to maintain the chuck leakage current at a substantially constant level. In this manner, different types of wafers can be chucked without subjecting them to inordinate amounts of current that may cause electron emission and/or wafer sticking at the end of the process.

The DC power supply is formed by "piggybacking" a negative voltage supply and a positive voltage supply while enabling the overall power supply to sink and source current at any output voltage polarity. In the illustrated implementation, a negative voltage supply having a negative peak voltage in excess of the maximum negative voltage requirement is coupled to a positive voltage supply having a positive peak voltage in excess of the maximum positive voltage requirement plus the peak negative voltage. The output of the negative voltage supply forms a fixed reference voltage for the positive voltage supply. In this manner, only the positive supply needs to be varied to swing the combined output to any voltage desired between the negative and positive requirements of the system. In addition, the outputs of the supplies are each preloaded with a constant current sink circuit such that the system may provide the chucking system with positive (current source) or negative (current sink) current at any voltage between the maximum negative to the maximum positive supply voltages.

BRIEF DESCRIPTION OF THE DRAWINGS

The teachings of the present invention can be readily understood by considering the following detailed description in conjunction with the accompanying drawings, in which.

DETAILED DESCRIPTION

Figure 1:
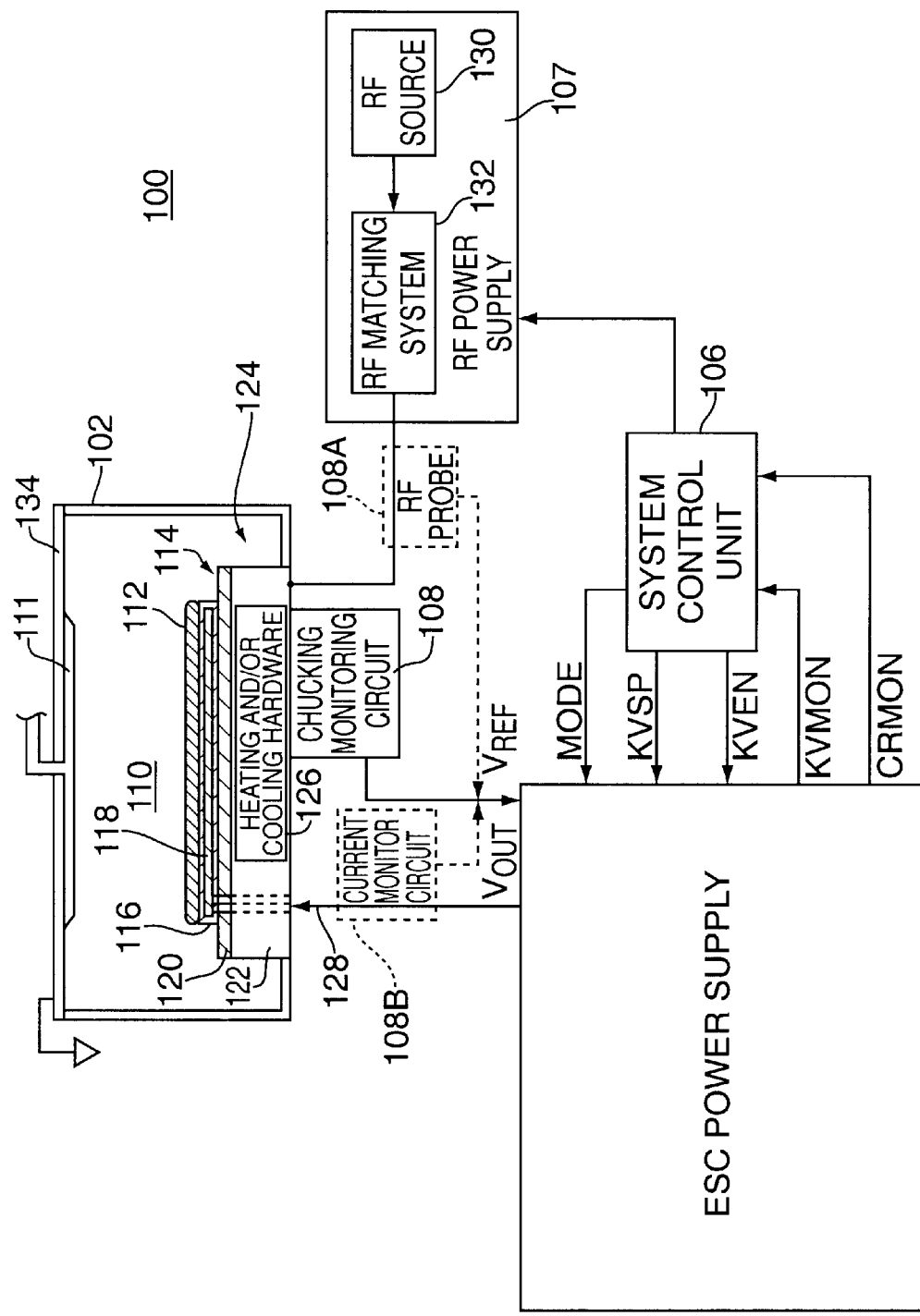
FIG. 1 depicts a system block diagram of a semiconductor wafer processing system incorporating the present invention.

FIG. 1 depicts a system block diagram of semiconductor wafer processing system 100 that embodies the present invention of a dynamic chucking voltage control technique that produces a chucking voltage to optimize one or more process parameters. Specifically, the electrostatic chuck power supply 104 generates an output voltage that is responsive to an indicia of optimal chucking, i.e., an indicia that, for the wafer type and process being performed, indicates that the wafer is optimally chucked. The invention controls the chucking voltage to optimize a particular process parameter such as a constant wafer-to-chuck potential difference, a constant chuck leakage current, a constant chucking force, a constant backside gas leakage rate or pressure, a constant DC bias voltage on the substrate, and the like. In the particular embodiments of the invention described below, feedback loops are provided to ensure that the chucking voltage dynamically varies to achieve constant desired result, e.g., constant potential difference or constant leakage current, such that optimal chucking for a particular wafer type and/or process is achieved.

The system 100 contains a process chamber 102, a variable, high voltage DC power supply (electrostatic chuck (ESC) power supply 104), a system control unit 106, an RF power supply 107 and a chucking monitoring circuit 108. The process chamber 102 contains a vacuum enclosure that defines a process region 110. A pedestal assembly 124 supports a semiconductor wafer 112 proximate the process region 110 and process gases are provided to the process region 110 through a showerhead 111 mounted to the top of the chamber 102. The pedestal assembly contains a pedestal base 122, heating and/or cooling hardware 126, and an electrostatic chuck 114. The heating and/or cooling hardware 126 conventionally contains coolant conduits or tubes, a resistive heater, conduits for supplying a heat transfer medium (e.g., helium) to the backside of the wafer, and the like. Such a process chamber is the model eMxP+ etch chamber manufactured by Applied Materials, Inc. of Santa Clara, Calif.

The electrostatic chuck 114 conventionally contains a dielectric body 116 containing at least one embedded electrode 118. The dielectric body 116 is generally attached to a mounting plate 120 that is affixed to the pedestal base 122 by conventional means such as bolts or clamps. The dielectric body 116 is fabricated from polyimide, aluminum nitride, alumina, boron nitride, and the like. The embedded electrode 118 is generally copper, molybdenum, titanium or tungsten. In the embodiment of the invention described below, the electrostatic chuck is a Johnsen-Rahbek chuck that is fabricated of a low resistivity ceramic such as aluminum nitride with a single molybdenum electrode. A DC voltage (a chucking voltage) is coupled to the electrode 118 via conductive path 128 to establish a potential difference between the wafer 112 and the chuck electrode 118.

The chucking voltage is generated and controlled by the ESC power supply 104. The RF power supply 107 couples an RF signal to the pedestal base 122, a conductive element that forms a cathode electrode. The RF power supply 107 contains an RF source 130 and an RF matching network 132 connected in series to efficiently couple RF energy to the cathode electrode.

To process the wafer 112 with different chemistries in the vacuum chamber 102, a plasma is formed in the process region 110 of the process chamber 102. The plasma is formed by applying radio frequency (RF) energy to the cathode 122 via an RF power supply 107. An anode electrode, illustratively shown as the chamber lid 134 (and showerhead 111), is generally located in the process chamber 102 opposite the cathode electrode 122. The electric field generated between the anode and cathode excites a process gas to an ionic or plasma state.

Once a plasma has formed in the process region 110 above the wafer 112, the plasma self biases the wafer 112 to a DC potential. Because the chuck electrode 118 is biased with a DC voltage, there is a potential difference (ΔV) between the wafer 112 and the chuck electrode 118. The potential difference between the chuck electrode and the self biased wafer causes oppositely polarized charges to accumulate on the underside of the wafer and the electrode in the chuck. If the dielectric body of the chuck is fabricated of a low resistivity material such as aluminum nitride, the charges on the electrode will migrate to the surface of the chuck in accordance with the Johnsen-Rahbek effect. The accumulations of charge forms a Coulombic attractive force between the wafer and chuck that electrostatically retains wafer to the chuck surface. The retaining force is generally proportional to the square of the potential difference ($V_e - V_{dc}$) between the wafer 112 and the chuck electrode 118. If the dielectric body of the chuck is an insulator, then the Coulombic attractive force is between the chuck electrode 118 and the wafer 112. The retaining force in a Coulombic type chuck is also proportional to the square of the potential difference ($V_e - V_{dc}$) between the wafer 112 and the chuck electrode 118. However, the distance between charged surfaces in a Coulombic chuck is generally larger than the distance between charged surfaces in a Johnsen-Rahbek chuck; therefore, given the same chucking voltage, the chucking force is generally greater in a Johnsen-Rahbek chuck.

The invention monitors one or more process parameters to determine an optimal chucking voltage in response to the monitored process parameters. The parameters that are monitored could be potential difference between the wafer and chuck, chuck leakage current, chucking force backside gas pressure or leakage rate, wafer DC bias, and the like.

In one specific embodiment of the invention, the chucking monitoring circuit 108 (embodied as RF probe 108A) provides a signal $V_{ref}$ from which the potential difference between the wafer and chuck can be derived. The output voltage of the power supply 104 is adjusted to produce a chucking voltage that maintains a constant potential difference between the wafer and chuck.

To adjust the potential difference to compensate for chamber parameter fluctuations and other changes in wafer potential, the invention measures an indicia of the potential difference and then controls the chucking voltage to establish a constant difference potential. Generally, the potential difference is predefined as an optimal value for the particular process that is then being accomplished in the chamber. To monitor this potential difference, a sample of the RF signal coupled to the cathode (pedestal base 122) is extracted by an RF probe 108A. The output from the RF probe 108A is a DC signal ($V_{ref}$) having a magnitude that represents the peak or peak-to-peak RF voltage coupled to the cathode electrode.

This value forms an input to a transfer function that converts this value into a signal that approximates the DC voltage ($V_{dc}$) on the wafer. The specific transfer function used in a given system is derived from empirical study of a particular electrostatic chuck that is to be controlled by the system. One illustrative transfer function used for controlling the chucking voltage of an eight inch ceramic chuck is:

$$V_{dc}=((-1.032 \times V_p)+347)$$

where $V_{dc}$ is the estimated wafer potential; and $V_p$ is the peak RF voltage.

Alternatively, the sample forming signal $V_{ref}$ can be a DC bias voltage that represents the DC bias on the wafer or any other signal that can be used to compute the magnitude of the potential difference, e.g., capacitance between the wafer and chuck electrode, backside gas pressure, backside gas leakage rate, and the like. The only requirement for the signal is that it must be a indicative of the potential difference between the wafer and the electrostatic chuck. This sample voltage ($V_{ref}$) is used by the ESC power supply, as described in detail below with respect to operation in a voltage tracking mode, as indicia of an optimal potential difference between the wafer and chuck such that the ESC power supply adjusts its output voltage to maintain a constant potential difference between the wafer 112 and the electrostatic chuck 118.

In another embodiment of the invention, the chucking monitoring circuit 108 monitors the chuck leakage current (using current monitor circuit 108B) and the ESC power supply 104 adjusts the chucking voltage to achieve a constant leakage current. As such, for various wafer types, the current through the wafer is optimized to avoid electron emission and wafer sticking.

To implement chucking voltage optimization, the ESC power supply 104 is a variable, high voltage DC power supply that operates in three modes: 1) a fixed voltage mode wherein a set point signal controls the output voltage of the power supply to a fixed value with respect to ground, e.g., the chamber walls 102; 2) a voltage tracking mode wherein the power supply produces an output voltage that achieves a constant potential difference between the wafer and the chuck; and 3) a current tracking mode wherein the power supply produces an output current that is constant while varying the output voltage to maintain a constant leakage current value. Any one mode can be selected depending upon the type of wafer being processed or the type of process being performed in the chamber. Consequently, the power supply provides a flexible platform for implementing a variety of chucking voltage optimization techniques.

To establish an optimal chucking voltage for a given process or wafer type, the system control unit 106 provides a set point signal KVSP to the ESC power supply 104. The system control unit 106 also provides an enabling signal KVEN to the supply 104. The set point is indicative of a desired voltage when the power supply 104 is operating in a fixed voltage mode; is indicative of a desired potential difference between the electrode and wafer when the power supply is operating in the voltage tracking mode; and is indicative of a desired leakage current when operating in a current tracking mode.

In addition to the set point and enable signals, the system controller also provides a tracking mode selection signal MODE or the mode selection may be hardwired by manipulation of conductive jumpers within the power supply. This MODE signal selects a power supply mode such that the power supply will produce a fixed high voltage output, a voltage tracking high voltage output, or a current tracking high voltage output. Each of these modes is discussed in detail with respect to FIG. 2 below. In each of these modes, the power supply 104 produces a high voltage output ($V_{out}$) in the range of −2000 volts to +1000 volts that is capable of sourcing or sinking current in the range of +2.2 mA to −1.1 mA. The power supply 104 also produces a voltage monitoring signal KVMON and a current monitoring signal CRMON that are used by the system control unit 106 to ensure that the power supply 104 is operating within proper limits and in accordance with its predefined set point KVSP.

Figure 2:
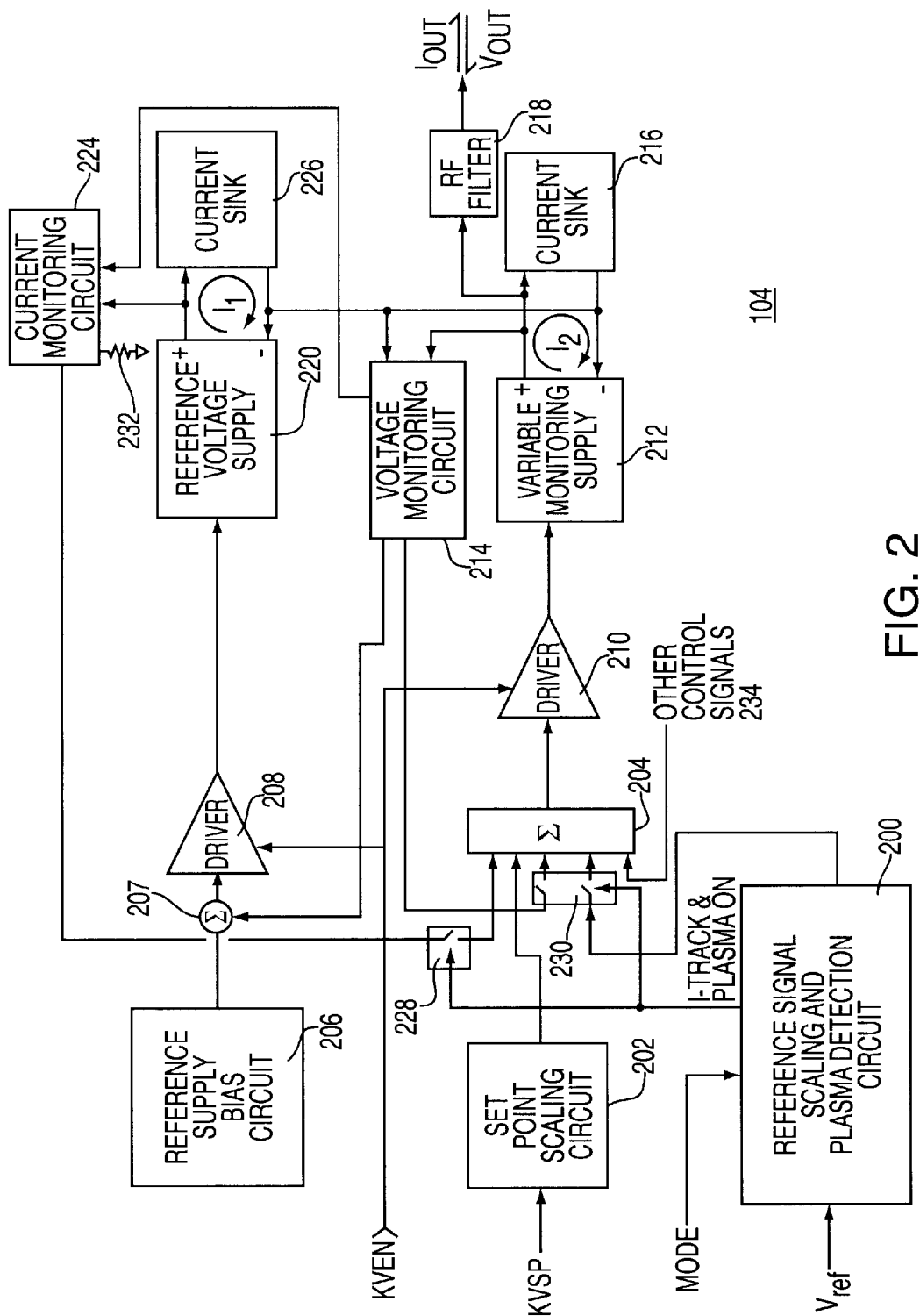
FIG. 2 depicts a detailed block diagram of the variable, DC voltage power supply of the present invention.

FIG. 2 depicts a detailed block diagram of the high voltage DC power supply 104. The supply 104 contains a reference signal scaling and plasma detection circuit 200, a set point signal scaling circuit 202, a summer 204, a reference supply bias circuit 206, a pair of drivers 208 and 210, a pair of DC-DC converter voltage supplies 212 and 220, a voltage monitoring circuit 214, a current monitoring circuit 224, a pair of current sinks 216 and 226 and an RF filter 218. The power supply 104 contains a pair of voltage supplies that are connected such that voltage supply 220 produces a fixed voltage reference for the variable voltage supply. Specifically, the reference voltage 220 supply is biased by a fixed voltage to generate a constant negative reference voltage (e.g., −2000 volts) that is coupled to the negative terminal of the variable voltage supply 212. The variable voltage supply 212 varies from, for example, 0 to +3000 volts across its output terminals. However, when referenced to the reference voltage of supply 220, the variable voltage supply 212 creates a voltage at $V_{out}$ that varies from −2000 volts to +1000 volts. As such, a high voltage DC power supply is created.

Figure 4:
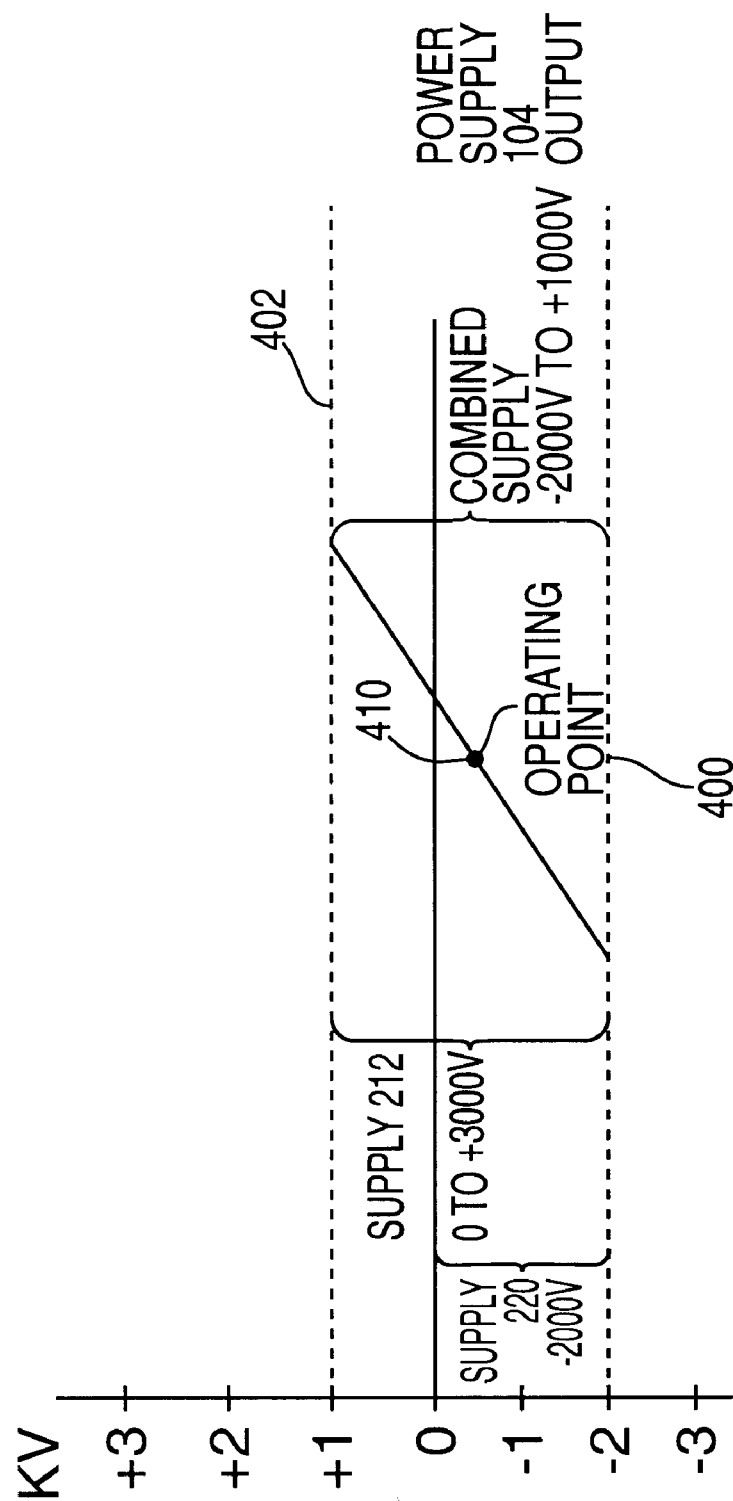
FIG. 4 depicts a graphical representation of the operation and output from the power supply illustrated in FIGS. 1 and 2. To facilitate understanding, identical reference numerals have been used, where possible, to designate identical elements that are common to the figures.

This additive function is best understood with the graph shown in FIG. 4 where the reference voltage 400 of −2000 volts is added to the variable voltage 402 of 0 volts to +3000 volts providing a bipolar supply which can be easily controlled to provide any positive or negative voltage between −2000 volts and +1000 volts.

Returning to FIG. 2, the reference voltage scaling and plasma detection circuit 200 applies a transfer function to the input reference voltage to produce a signal (an estimated $V_{dc}$ signal) representing the wafer voltage $V_{dc}$ and also scales the estimated $V_{dc}$ to a level that is comparable to the other signals that are coupled to the summer 204. If the wafer voltage $V_{dc}$ is measured directly, the transfer function is not used and the signal is only scaled. Additionally, estimated wafer voltage is compared to a threshold level such that when the estimated wafer voltage attains a predefined level, the circuit 200 deems the plasma to be ignited in the chamber. This is important to the current tracking mode of operation. The current tracking mode can not be used if a plasma does not exist in the chamber because no leakage current flows through the chuck without the plasma providing a conductive path from the wafer to ground. Additionally, circuit 200 contains circuitry that selects the operating mode of the power supply, that is whether the power supply produces a fixed voltage output, a voltage tracking output or a current tracking output. The operation and structure of the scaling and plasma detection circuit 200 shall be described in further detail with respect to the schematic diagram of FIG. 3A below.

The set point signal scaling circuit 202 scales the set point signal to a level commensurate with the other signal levels that are coupled to the summer 204. The summer 204 combines the various signals from the voltage monitoring circuit 214, the scaled set point signal, and the scaled reference signal to form an input voltage for driver 210. Different signals are applied to the summer depending upon the mode of operation for the power supply 104.

When operating in the fixed voltage mode, the current monitoring signal (current feedback) is disconnected from the summer 204 by an analog switch 228. The analog switch 230 connects both the voltage monitoring signal (voltage feedback) and a fixed reference voltage to the summer 204. As such, the set point signal establishes the absolute output voltage with respect to ground from the power supply.

When voltage tracking mode is selected, the scaled set point signal, the scaled reference signal (representing a wafer potential) and the voltage monitoring signal (three signals) are coupled to the summer 204 and the current monitoring signal is disconnected from the summer 204. As such, the summer 204 compares the difference between the scaled set point signal and the scaled reference voltage (this difference represents a desired wafer-to-chuck potential difference) to the voltage monitor output signal and produces a difference signal that is applied to the driver 210. The driver, in turn, controls the variable voltage supply to attain the necessary chucking voltage that will produce the desired voltage potential difference between the wafer and the chuck.

More specifically, the reference supply bias circuit 206 establishes a bias voltage that is applied through the driver 208 to the input of the reference voltage supply 220, e.g., a high voltage DC-DC converter that, for example, produces an output voltage in the range of 0 to 3000 volts for a respective input voltage in the range 0 to 15 volts. In response to the input bias voltage, the reference supply 220 produces a fixed output voltage between the (+) and (−) terminals, e.g., a fixed voltage of 2000 volts. Voltage feedback for the reference voltage supply 220 is provided from the voltage monitoring circuit 214. The feedback signal is applied to a summer 207 located at the input to driver 208 such that the input signal to the driver is a combination of the bias voltage and the feedback voltage. The output current of the reference voltage supply 220 is set to a nominal flow by the current sink 226 that is coupled to the (+) and (−) output terminals of supply 220. As such, if the supply 220 is capable of sourcing, for example, 3.3 mA, the current sink 226 can be set to continuously sink a nominal flow of current of 1.1 mA. The nominal flow is identified as $I_1$. As the current requirements of the reference voltage supply vary, the current that the supply can provide out of the (+) terminal may increase to as much as 3.3 mA.

The negative voltage (relative to ground) produced at the (−) terminal of the reference voltage supply 220 is used as the reference voltage level for the variable voltage supply 212. The output of the summer 204 establishes a variable voltage that either tracks the difference between $V_{ref}$ and the set point, e.g., tracks the potential difference, or tracks the output current from the supply 104 to ensure that the current is constant while varying the output voltage to maintain the constant current.

A control signal (a difference signal) is applied to the variable voltage supply 212 through the driver 210. The variable voltage supply 212 is a high voltage DC-DC converter that, for example, generates an output voltage in the range of 0 to 3000 volts in response to an input voltage in the range 0 to 15 volts. The (−) output terminal of the supply 212 is coupled to the (−) output terminal of the reference voltage supply 220. As such, the (+) terminal is "offset" by the reference voltage (e.g., −2000 volts). A current sink 216 is coupled across the (+) and (−) output terminals of the variable voltage supply 212. This current sink draws a nominal current ($I_2$) from the variable supply 212, e.g., 2.2 mA.

In the voltage tracking mode and in the fixed voltage mode, a voltage monitoring circuit 214 supplies a feedback voltages to both summer 204 and summer 207. This voltage dampens the response of the power supply 104 to transients in the chamber parameters that may cause the chucking voltage or current to vary. As such, the power supply 104 is very stable even when faced with a widely varying load impedance.

When current tracking mode is selected and a plasma is present, circuit 200 produces a signal that controls both switches 228 and 230 such that the current monitoring signal is coupled to the input of the driver 210 and the voltage reference signals are disconnected from the summer 204. In this mode, the set point signal indicates a current value (the desired leakage current) that the output current $I_{out}$ is to achieve. As such, the summer 204 compares the current monitoring signal to the set point signal to produce a difference signal that is used to control the driver 210 and the variable voltage supply 212. Adjustment to the output voltage is made until the output current attains the set point level. The chucking voltage is dynamically adjusted by the power supply 104 to maintain a constant output current.

To facilitate current tracking mode, the current monitoring circuit 224 produces a current monitoring signal that represents the leakage current to/from the electrostatic chuck. In essence, the circuit 224 computes the leakage current by measuring a voltage drop across a resistor 232 to ground and then subtracting the current flowing in the voltage monitoring circuit 214. The result is a measure of the leakage current ($I_{out}$) only.

The RF filter 218 blocks RF energy from the chuck from entering the power supply 104.

In the fixed voltage mode, the scaling circuit 200 for the reference voltage is disabled and the scaled reference voltage is clamped to a predetermined value such that the set point signal KVSP sets the output voltage to a fixed value. That fixed value can be anywhere between the reference voltage supply generated reference voltage (e.g., −2000 volts) and the highest output voltage of the variable voltage supply less that reference voltage (e.g., a maximum voltage of +1000 volts, assuming the maximum voltage generated by the variable voltage supply 212 is +3000 volts). In the fixed voltage mode, a constant voltage is supplied to the chuck. Although a constant voltage is supplied, the current coupled to the chuck may vary substantially. Current fluctuations are due to variations in the chamber environment that cause changes in $V_{dc}$ on the wafer or are due to changes in electrode voltage set point. At times, the current can be negative (i.e., the supply 104 must sink current) and at other times, the current is positive (i.e., the supply 104 must source current). By having the power supply 104 arranged to sink a nominal amount of current from each voltage supply 220 and 212, the power supply can both source or sink current through a single output port. This capability is particularly important at the end of wafer processing when the RF power is ramped down. For example, as the RF power is ramped down, it is advantageous to maintain the wafer in a chucked state using a constant voltage; however, during ramp down a current surge from the chuck is experienced in response to the change in the potential difference between the chuck and the wafer, i.e., the wafer potential $V_{dc}$ is changing as the RF power is ramped down. The invention sinks this current surge while maintaining a constant chucking voltage on the wafer.

To further illustrate the operation of the invention, when a positive current is necessary, the variable voltage supply sources current to the $V_{out}$ terminal up to 2.2 mA (i.e., the difference between the maximum current (e.g., 3.3 mA) less the current sink 216 current ($I_2$) (e.g., 1.1 mA) plus the current ($I_1$) available from the current sink 226. On the other hand, when the ESC power supply 104 must sink current, this current cannot be "pushed" into the (+) terminal of a power supply; therefore, the current sink 216 sinks the current supplied by the $V_{out}$ terminal plus any additional current from the (+) terminal to achieve the necessary current level. As such, when a full 2.2 mA of current is pulled from the supply 104, maximum current is supplied by the variable voltage supply 212, i.e., 3.3 mA from the supply 212 with 2.2 mA of output current to the chuck, 1.1 mA of current sink 226 current, and 0 mA (minimum current) supplied by the reference supply 220 with 2.2 mA of current flowing through current sink 226. Similarly, when a full 1.1 mA of current flows into the power supply 104 to maintain a particular voltage level, the maximum current is supplied by reference voltage supply 220, i.e., 3.3 mA from the supply 220 with −1.1 mA of output current, 2.2 mA of corresponding current sink 226 current and the minimum current 0 mA provided by supply 212 with 1.1 mA flowing through corresponding current sink 216.

In the voltage tracking mode, the output voltage $V_{out}$ of the power supply 104 tracks the $V_{ref}$ voltage that represents the potential difference between the chuck and the wafer. The voltage feedback loop represented by the variable power supply 212, the voltage monitoring circuit 214, the summer 204, and the driver 210 attempts to maintain the output chucking voltage at the set point value KVSP less the reference voltage $V_{ref}$. Consequently, a constant potential difference will be maintained between the chuck and the wafer. During voltage tracking mode, the current monitoring circuit does not supply a signal to the summer 204, i.e., switch 228 is open. The difference between the set point value and the reference value (dampened by the voltage monitoring circuit value, a voltage feedback signal) is coupled to the driver 210. The driver, in turn, varies the input voltage to the variable voltage supply in accordance with the difference voltage. The variable voltage supply 212 produces a voltage at terminal $V_{out}$ that tracks the reference voltage to achieve a constant potential difference between the chuck and the wafer. While maintaining this constant force, the power supply can both sink and source current as discussed above.

In the current tracking mode, the power supply 104 attempts to maintain a constant current (a leakage current of between 2 and 200 μA that will not result in electron emission from the wafer) delivered to the chuck electrode no matter the voltage necessary to achieve that current. The current tracking mode is significant when minimizing the "sticking" of wafers to the chuck due to residual charge accumulation. Minimizing the current through the wafer minimizes emission and residual charge accumulation. As such, the power supply monitors the output current $I_{out}$ using the current monitoring circuit 224 and supplies a signal to the summer 204 that is indicative of the output current. When the power supply 204 is in the current tracking mode, the summer 204 operates upon only the current measuring signal and the set point value for the current. The analog switch 228, operating in response to the plasma "on" signal, couples the current monitoring signal to the summer 204. As such, the output voltage $V_{out}$ strives to maintain a constant output current that is consistent with the set point current value. Generally, the set point current value is constant from wafer-type to wafer-type in an attempt to avoid wafer sticking for a given wafer-type. For example, the leakage current set point is the same for a silicon wafer as it is for an oxide wafer. With a current setting that avoids emissive behavior, the chucking voltage will vary to maintain the desired leakage current level without causing charge emission. The set point current value usually produces a current in the 2 to 200 μA range, with a preferred range of 2 to 20 μA.

An alternative to using a predefined set point current value, the system can establish a set point by applying a relatively high voltage pulse to the chuck electrode while the wafer is present and the plasma is ignited, but before processing has begun. The current monitoring circuitry monitors the leakage current (an instantaneous leakage current) that develops as the pulse is applied. This instantaneous leakage current is then used as the set point leakage current or the set point is a value that is proportional to the instantaneous leakage current.

It should be noted that by mitigating electron emission, the wafers can be readily dechucked by applying a negative dechucking voltage, e.g., −200 volts, after the plasma has been extinguished. Such a negative voltage repels the charges on the backside of the wafer away from the chuck surface. Consequently the attractive force is diminished and the wafer can be easily lifted from the chuck surface without the risk of wafer "pop off" or wafer breakage.

Although the current tracking mode used only a feedback signal from the current monitoring circuit, the power supply could combine current and voltage feedback such that the voltage monitoring signal is applied to the summer 204 along with the current monitoring signal. The summer 204 can be used to combine various levels of voltage and current feedback to accomplish a more complex scheme of chucking voltage control.

Furthermore, other control signals can be applied to the summer 204 at port 234. These control signals can be other indicia of optimal coupling such as a backside gas leakage rate indicator, a signal representing capacitance between the wafer and chuck, and the like. When using such a signal, a set point for that signal can be applied to the set point input KVSP. As such, the chucking voltage could be used to alter the backside gas flow rate, the wafer-to-chuck capacitance, and the like, to achieve optimal chucking for a particular wafer and process combination.

Figure 3A:
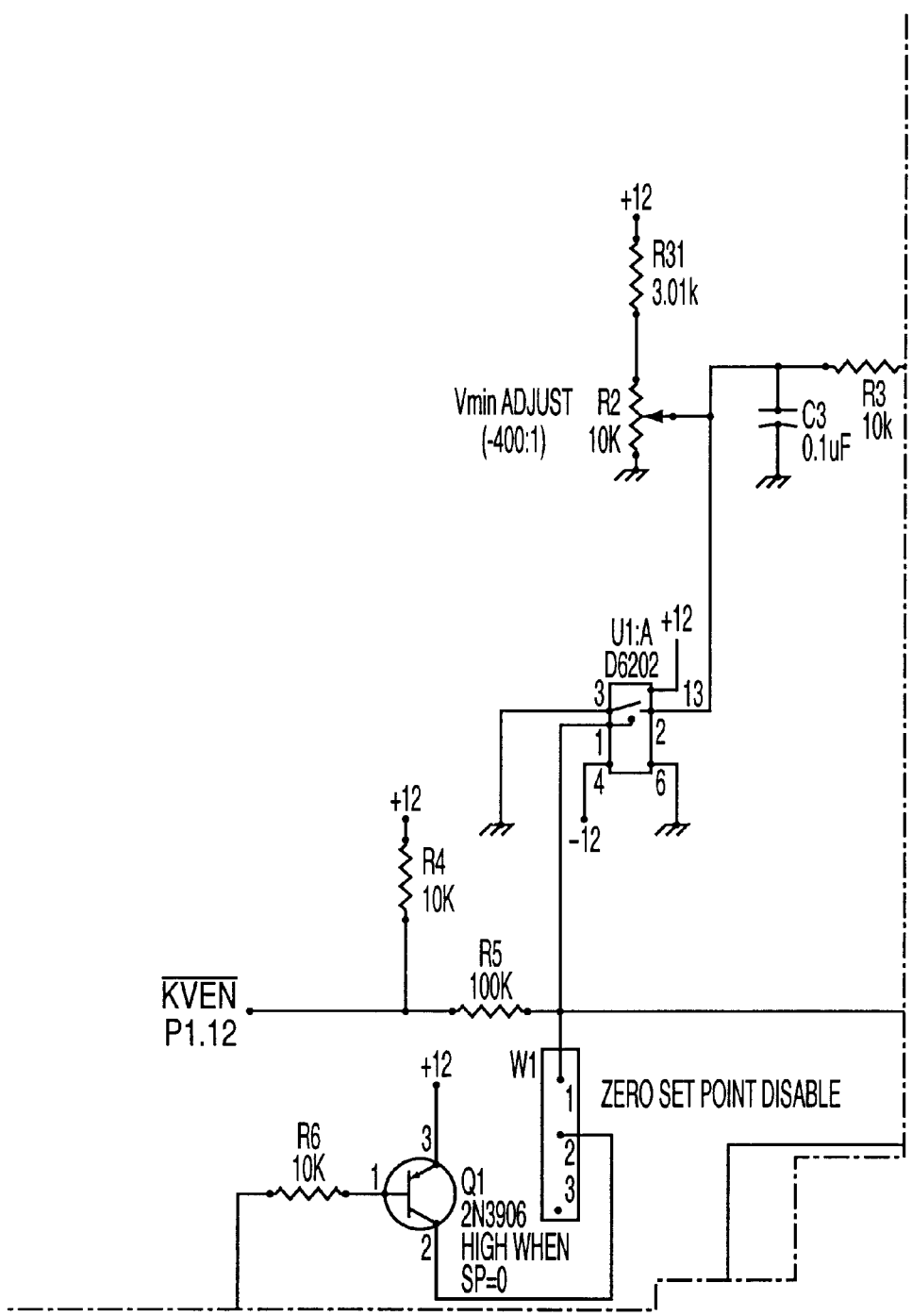
FIG. 3A–3C together depict a detailed electrical schematic of the variable DC voltage power supply illustrated in FIG. 1 and 2.
Figure 3B:
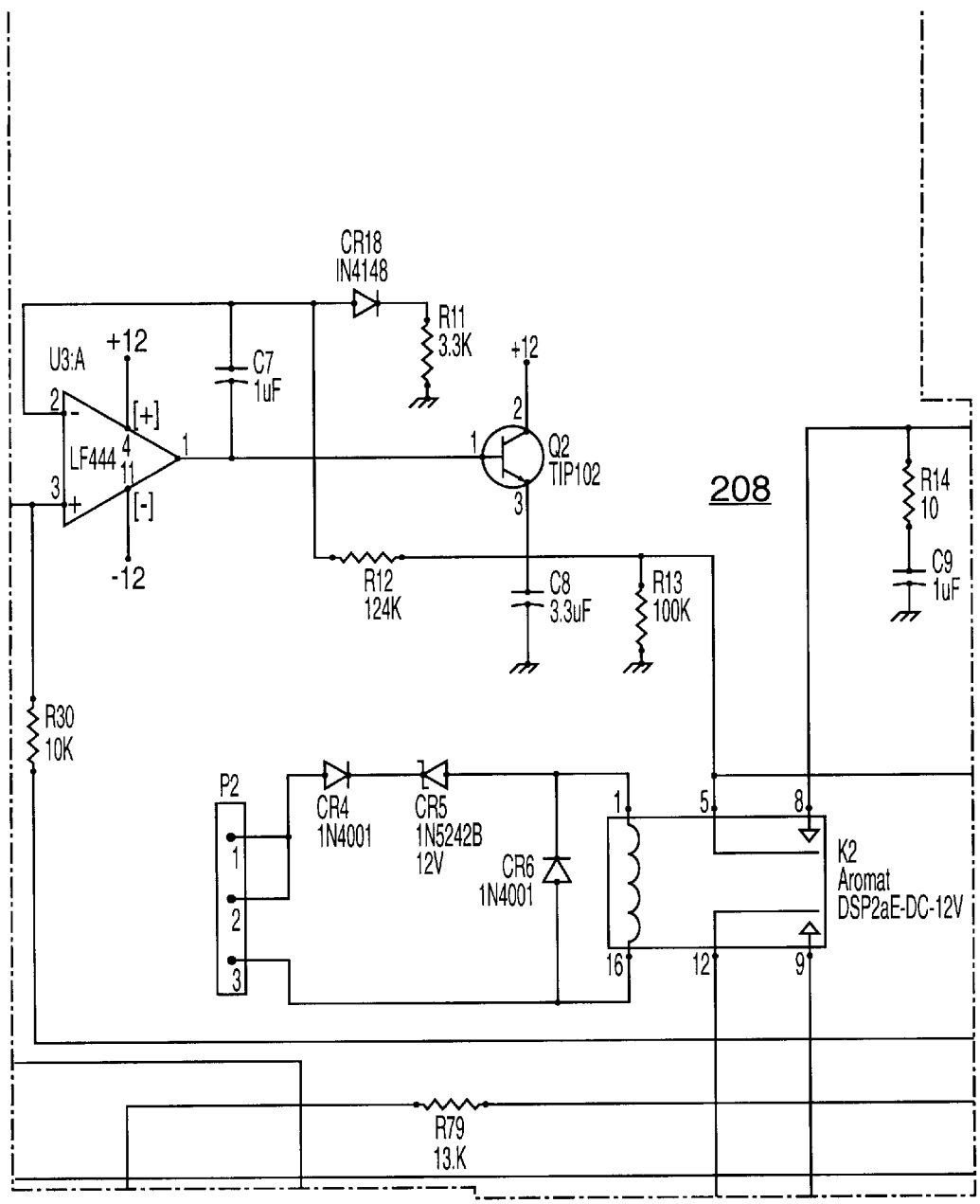
Figure 3C:
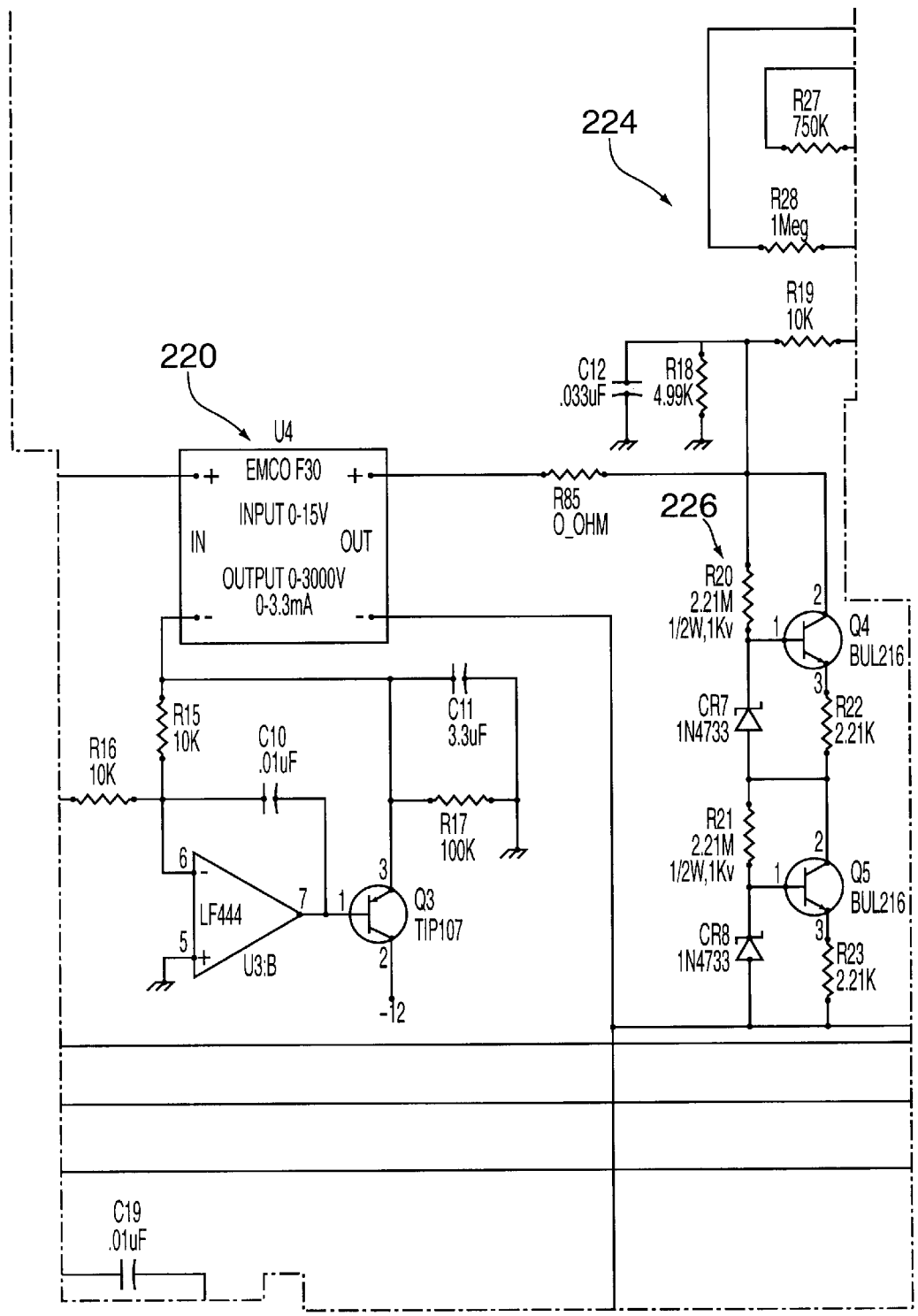

FIG. 3 depicts the proper alignment of FIGS. 3A, 3B and 3C. These figures taken together depict a detailed schematic of one embodiment of the inventive power supply 104. To best understand the invention, the reader should simultaneously refer to all three figures while reading the following description.

FIG. 3A depicts a detailed schematic diagram of the reference signal scaling and plasma detection circuit 200. The input circuitry contain a pi-connection of resistors R49 and R50 with capacitor C29 to provide a high input impedance and filtering for the reference signal $V_{ref}$ An op amp U8:A, connected to the pi circuit, provides input buffering. An output of op amp U8:A is coupled to an absolute value generation circuit containing op amp U8:C, diodes CR10 and CR11, and resistors R54 and R51. This circuit produces an absolute value of the input voltage such that positive and negative values of the reference signal are coupled to the input of scaling op amp U8:B as a positive voltage.

The transfer function is established in part using the circuit containing resistors R52, R53 and potentiometer R55. The potentiometer, connected between the op amp output terminal and the negative input terminal, controls the gain of the circuit such that the output voltage is equal to −R55/R52($V_{in}$). This voltage is then offset by a DC level that is created by the series connected resistors R62, R63 and R64. Resistor R60 couples the signal from U8:B to the amplifier U8:D and resistor R39 couples the scaling voltage to amplifier U8:D. The transfer function that is established by this circuitry for an eight inch ceramic electrostatic chuck is:

$$V=((-1.032 \times V_{in})+347)$$

where

V is the signal at the input of op amp U8:B $V_{in}$ is the input to the circuit 200.

The gain of the amplifier U8:B is set by R39 and R61 such that all the circuitry scales the signal from the transfer function by approximately 400:1. The scaled signal exits the circuit 200 at point A (to FIG. 3B) and C (to FIG. 3C).

To detect the existence of plasma in the chamber, a comparator U2:B is coupled to the potentiometer R55 such that when a reference voltage of greater than a certain magnitude (e.g., 50 volts) is applied to the input of the circuit 200, the output of comparator U2:B changes state. Comparator U2:B is wired as a threshold detector having a threshold established by resistors R56 and R57. When a voltage of sufficient magnitude is detected, the comparator changes state to indicate that the plasma has been ignited, i.e., the reference voltage has substantial magnitude when a plasma is in the chamber. By changing state, switch U9:D is open when a plasma is detected and closed when a plasma is not detected. When closed, a path to ground draws current through diode CR15 and resistor R82 such that switch U9:C is closed. When this switch closes a voltage drop across R59 is applied to this input of the op amp U8:D such that a signal representing −500 volts will be subtracted from the set point value (using summer 204 in FIG. 3B). It should be noted that the set point signal of this implementation is expected to be a positive value. The set point signal in other implementations may be positive or negative, in which case, this switch does not have to be implemented.

By using the implementation shown, when a plasma is not detected, the power supply does not operate in a voltage tracking mode and the set point value less 500 volts is used to dechuck the wafer, i.e., a negative voltage is applied to the chuck to discharge any residual charge accumulated on the chuck. The dechucking voltage is automatically generated by establishing a plasma detection threshold that is higher than a value that indicates the plasma has been extinguished. For example, the threshold can be selected to be −380 volts such that the plasma detection circuit will switch states as the RF power is ramped down (but is not yet off). As such, at the lower level of RF, the comparator U2:B causes switch U9:D to open and switch U9:C closes to apply a fixed offset voltage to the op amp U8:D to produce a fixed −500 volt. When this fixed voltage is subtracted from the set point voltage of, for example, 450 volts, a dechucking voltage of −50 volts is automatically applied to the chucking electrodes in response to a ramp down of the RF power.

The mode selection jumper block W2 operates to connect certain elements of the circuitry to enable the various modes to be implemented. For example, in the fixed voltage output mode, the +12 volts on pin 6 is connected to pin 5 such that switch U9:B is enabled. This applies a fixed offset voltage (e.g., the voltage drop across R81 from the −12 volt supply that represent −1000 volts) to the input of op amp U8:D. This signal will be subtracted from the set point signal and permit a negative set point voltage. Although a jumper block is shown for mode selection, alternatively a electronically selectable mode selection circuit could be implemented.

Points B and C of circuit 200 proceed to FIG. 3B, while point C carries to FIG. 3C. Continuing to FIG. 3B, the plasma detection signal (point B couples to a switch U1:C that is closed during voltage tracking and fixed voltage operation and is open during current tracking mode. The scaled reference signal (or the offset signals) from circuit 200 are coupled to point A and to resistor R65. The summer 204 is formed by op amp U3:C and resistors R65, R38, R40, and R36.

The set point signal KVSP is coupled through a pi network (resistors R9 and R10 and capacitor C4) to a buffer op amp U6:A. The output of the buffer is coupled to a scaler circuit 202 containing op amp U6:B and its support resistors R45, R47, and R44. The amount of signal scaling is set by a potentiometer R43, and resistor R43 and R42 combination that is coupled to the negative input of the op amp. The output of op amp U6:B is coupled through a diode CR9 to resistor R40, an input resistor of the summer 204. The circuitry 202 ensures that the signal KVSP can be adjusted to match the magnitude of the reference signal from circuit 202.

At the summer 204, the reference signal (a negative value is summed with the set point signal (a positive value) as well as an output voltage feedback signal D (a positive value that is derived in the output circuits of FIG. 3C). The feedback signal is a damping signal that lowers the gain of the overall circuitry due to filtering that occurs in the voltage monitoring circuitry described below.

The amplifiers U3:C and U3:D together form a driver for a voltage supply U7 (210 in FIG. 2), e.g., a model F30 manufactured by EMCO. Each driver contains an op amp U3:C or U3:D and a NPN or PNP transistor Q6 or Q7, respectively. The drivers form a symmetric circuit that provides a 0 to 15 volt signal to the input (+) and (−) terminals of the voltage supply U7. Note that the power for the power supply circuitry is ±12 volts. As such, only 0 to 12 volts is readily available for control of the voltage supply U7. Consequently, the symmetrical driver is implemented to enable the full input voltage swing to be available, e.g., 0 to 15 volts. In short, the difference signal is equally divided and coupled to each driver such that one driver (op amp U3:C) drives the input (+) terminal and the other driver (op amp U3:D) drives the input (−) terminal. As such, up to 24 volts can theoretically be applied across the voltage supply U7 input terminals. However, a practical limit is 24 volts less the voltage drops across the op amps and base-emitter junctions of the transistors, e.g., less 6.2 volts.

Specifically, the op amp U3:C drives the base of the transistor Q6 while the collector is connected to +12 volts. The op amp U3:D drives the base of the transistor Q7 that has its collector connected to −12 volts. The emitter of each transistor Q6 and Q7 is connected to the negative input terminal of the DC-DC converters U7 and U4. The input terminals are also coupled to ground through respective filter capacitors C22 and C20. Resistor R36 and diode CR16 provide feedback from the emitter of transistor Q6 to the input of op amp U3:C. Resistors R37, R33, R32, R34, R35, diode CR17 and capacitor C18 together with the active elements, op amps U3:D and U3:C and transistors Q6 and Q7, provide the symmetrical drive circuitry for the voltage supply 212. In this manner, the difference signal (set point plus a negative reference voltage plus a voltage feedback signal) is amplified and applied to the voltage supply as a 0 to 15 volt control signal to proportionally produce a 0 to 3000 volt output voltage. Additionally, by using an input voltage that is derived from a balanced ±12 volts, the ground current at the input to the entire high voltage module 104 will be small and thus not produce an offset voltage with respect to ground.

The reference voltage supply 220 (U4) is driven in the same manner as the variable voltage supply 212 except that the driver input voltage for supply U4 is a fixed reference voltage. The reference voltage is established by resistor R31 and potentiometer R2. The reference voltage is coupled to the symmetric drivers (op amps U3:A and U3:B and their respective support circuits) having an identical circuit arrangement as described in connection with driver 210. Consequently, a fixed input voltage in the range 0 to 15 volts is applied across the input terminals of the voltage supply U4 to produce a fixed output voltage in the range 0 to 3000 volts. Illustratively, the output voltage is set to 2000 volts.

A safety interlock circuit is provided to ensure that when electrostatic chuck is removed from the process chamber that the power supply 104 is rendered inoperative. Connector P2 is an interlock connector (e.g., +24 volts at pin 1, +24 volts at pin 2, and 24 volt common at pin 3) and the interlock circuit is formed by series connected diodes CR4, CR5 (a zener diode) and CR6. A relay is connected such that its drive coil is coupled across diode CR5. The relay switches are respectively in the path between the driver transistors Q6 and Q7 such that when the interlock relay loses power due to connector P2 being unplugged or the interlock circuit being externally incomplete, the relay switches open circuit to disconnect the voltage supplies U4 and U7 from their respective drive voltages. The voltage sources thereby are effectively disabled.

The power supply 104 can produce two types of zero outputs; an active zero output and a floating zero output. The active zero output occurs when the difference signal truly sets the output voltage to zero while having the supply source and sink current. If the set point signal is set to zero, the drivers are turned off and the power supply creates a floating zero. While operating in a floating zero state, the voltage supplies, by having zero input voltage, are deactivated and the output port of the power supply is merely loaded by the (inoperable) current sink circuit 216 (FIG. 2 and FIG. 3C) which, in this state, operates as a resistive load, e.g., an 11 MΩ resistor, to ground. When the voltage across the current sinks decreases below a certain level, the current sinks deactivate and become inoperable. At that time, the current sinks operate as a resistive load.

To achieve a floating zero, a zero set point is applied to the summer 204 and the voltage supply U7 will have a zero voltage across its input terminals. However, to achieve a zero voltage across the input terminals of U4, the fixed reference voltage must be disconnected. A threshold detector (comparator U2:A and resistors R7 and R8) determines when the set point is set to zero. The threshold detector is coupled to the buffer op amp U6:A and drives a PNP transistor Q1. The transistor controls a switch U1:A that, when a zero set point is detected, connects the bias voltage input to ground. As such, the input to driver 208 is ground and zero volts will be applied across the input terminals of U4. The floating zero operation can be disable by adjusting the jumpers in jumper block W1 such that the transistor Q1 is disconnected from the switch U1:A.

The ENABLE signal controls the positions of switches U1:A and U1:D such that a low ENABLE signal opens switch U1:A to disconnect the input bias from ground and opens switch U1:D to remove a short from being placed across the input to output of the op amp U3:C. As such, the low ENABLE signal makes the power supply 104 operative. A high ENABLE signal applies zero bias voltage to driver 208 and shorts driver 210 making the power supply 104 inoperative.

Comparator U2:D, switches U1:B and U1:C, and resistor R79 are used during current tracking mode. The plasma detection circuitry 200 provides a plasma detection signal at point B. This signal is coupled to comparator U2:D and U2:D is coupled to the control ports of both switches U1:B and U1:C such that when a plasma is detected while the power supply is in a current tracking mode, the reference voltage at point A is disconnected from the driver 210 by switch U1:C. Feedback of a signal representative of the output current is provided from point J through resistor R79 is coupled through switch U1:B to the input of diver op amp U3:C. As such, the output voltage for the electrostatic chuck is determined by the set point and then adjusted in accordance with the current tracking signal to achieve a constant current to the chuck.

The signals from the circuitry of FIG. 3B that connected to FIG. 3C are the high voltage reference voltage across points E and F, the variable high voltage across points G and H, the voltage tracking feedback signal on point D, the current tracking feedback signal from point J and a negative voltage feedback value on point I.

The output voltage from the reference voltage supply U4 (points E and F) is applied across a current sink 226. The current sink may be as simple as a resistive load; however, a more stable current sink is an active, two stage circuit containing two NPN transistors Q4 ad Q5, resistors R20, R21, R22 and R23, and diodes CR7 and CR8. Each stage contains a transistor having its base connected to the collector through a resistor and the base connected to the emitter via a diode and a resistor. Each stage can handle a voltage drop of up to 1500 volts; therefore, to be conservative, each stage is designed to handle a drop of 1000 volts. The (+) terminal voltage at point E is coupled to the current sink 226 through resistor R85. The two transistor current sink continuously pulls 1.1 mA.

Similarly, a current sink 216 is coupled across the output terminals of the variable voltage supply U7. This current sink is comprised of three stages containing transistors Q8, Q9, and Q10, resistors R66, R67, R68, R69, R70, R71, and diodes CR12, CR13, CR14. This current sink draws a continuous 2.2 mA.

The (−) terminal of the reference voltage supply U4 is connected to the (−) terminal of variable voltage source U7. As such, the output ($V_{out}$) of the power supply 104 can vary from the negative reference voltage (−2000 volts) to a positive voltage equal to the maximum positive voltage available from the variable voltage supply (+3000 volts) less the reference voltage (2000 volts), e.g., +1000 volts. As described with respect to FIG. 2, the power supply can sink current (e.g., up to 1.1 mA) and source current (e.g., up to 2.2 mA). The output voltage from the variable voltage supply is coupled to the output port through a load resistor R86 and an RF filter containing C27 and L1.

To monitor the output current to facilitate current tracking, an op amp U5:A is coupled to the (+) terminal of the reference voltage supply U4. The signal from the positive terminal of supply U4 is filtered by parallel connected capacitor C12 and resistor R18. Further filtering is provide by capacitor C29 that is connected from input to output across the op amp U5:A. Resistor R18 is coupled from the sample point at the input to the current sink to ground and R19 is coupled from the sample point to the negative input of op amp U5:A. The negative op amp input is a virtual ground such that resistors R18 and R19 are in parallel and form the current sensing resistive element. The voltage developed across these resistors is representative of the output current of the power supply 104. Resistor R27 is driven by a buffer op amp U5:B. Op amp U5:B is coupled via resistors R24 and R25 to the negative terminal of the reference power supply and produces a signal representative of the voltage on that terminal. This signal is coupled through R27 to the input of the op amp U5:A. Additionally, the op amp U6:D produces a signal that is representative of the voltage out the output of the power supply 104. This op amp is coupled to the output path of the power supply via resistors R29 and R75 and capacitor C28. The output signal from the op amp U6:D is coupled through resistor R28 to the input of op amp U5:A. As such, the signal from R27 represents the current flowing through the reference voltage monitor and the signal coupled through R28 represents the current flowing through the variable voltage monitor. These two signals are subtracted from the current sample across resistors R18 and R19 such that the output of the op amp U5:A represents the current being delivered to the electrostatic chuck. This signal is buffered and provided as output CRMON, the current monitoring signal. The signal is also provided as a voltage signal (1 volt equals 300 uA) on port BNC3. The output from op amp U5:B is coupled to the input of U2:C which is configured as a threshold detector having a threshold set by series connected resistors R72 and R73. The output of the op amp U2:C drives a transistor Q11 to activate and deactivate a light emitting diode circuit (DS2 and R74 that indicates when the power supply is operating.

The voltage monitoring circuit contains op amp U6:D and U6:C to produce a voltage signal that represents the output voltage of the power supply 104. The op amp U6:C produces a difference voltage (ΔV) that is the difference between the output voltage coupled to the op amp through R76 and the signal on point C from circuit 200, i.e., the scaled reference voltage, that is coupled to the op amp via resistor R77. The op amp U6:C gain is controlled by resistors R78 and R41. The output of the op amp is voltage monitoring signal KVMON. This signal is intended, when the power supply is operating properly, to be equivalent to the set point value, a positive number.

By using the present invention, various chucking voltage control scenarios can be flexibly utilized to achieve optimal chucking for particular wafer type and process combinations. In the fixed voltage mode, the electrostatic chuck can be operated in a conventional manner; in the voltage tracking mode, the electrostatic chuck can be operated to achieve a constant potential difference between the chuck and wafer through various processes and wafer types; and in a current tracking mode, the electrostatic chuck can be operated to provide a fixed leakage current through the chuck such that electron emission is mitigated. As such, by selecting an appropriate mode, a wafer experiences a well controlled thermal environment such that processes are adequately performed and the wafer does not generate particulate contaminants or experience electron emission. Also, since a predefined chucking voltage is optimally created for each process, excessive chucking force is not used and the wafers readily dechuck.

Although various embodiments which incorporate the teachings of the present invention have been shown and described in detail herein, those skilled in the art can readily devise many other varied embodiments that still incorporate these teachings.

What is claimed is:

1. Apparatus for retaining a substrate, in a semiconductor processing system comprising:
    an electrostatic chuck having an electrode embedded beneath a substrate support surface;
    a power supply, coupled to said electrode of said electrostatic chuck, for applying a variable chucking voltage to said electrode, where said substrate is retained by a potential difference between said substrate and said electrostatic chuck;
    a monitoring circuit, coupled to said electrostatic chuck, for measuring a peak-to-peak or peak voltage of a signal used to generate a plasma in said semiconductor processing system and for generating a chucking indicator value from said peak-to-peak or peak voltage; and
    a controller, coupled to said power supply and said monitoring circuit, for dynamically maintaining said potential difference at a predefined value in response to said chucking indicator value.

2. The apparatus of claim 1 further comprising an RF power supply, coupled to a cathode electrode, for supplying RF energy to said plasma in a vacuum chamber, where said monitoring circuit is coupled to said cathode electrode to detect said peak-to-peak or peak voltage on said cathode electrode as the chucking indicator value.

3. The apparatus of claim 2 wherein said indicator value is a peak-to-peak or peak voltage of an RF voltage coupled from the RF power supply to the cathode electrode.

4. The apparatus of claim 1 wherein said variable chucking voltage has a voltage range which is positive and negative.

5. The apparatus of claim 1 wherein said power supply can both source and sink current.

6. The apparatus of claim 1 wherein said power supply further comprises:
    a reference voltage supply having a constant reference voltage output that is referenced to ground;
    a variable voltage supply having a variable voltage output with reference to said constant reference voltage, where an output voltage of the variable voltage supply with reference to ground being the variable chucking voltage, the output voltage has a first output voltage limit equal to the constant reference voltage output voltage and a second output voltage limit equal to a maximum variable voltage available from the variable voltage supply less the constant reference voltage output;
    a first current sink, coupled to the reference voltage supply, for drawing a constant current from said reference voltage supply; and
    a second current sink, coupled to the variable voltage supply, for drawing a constant current from said variable voltage supply.

7. The apparatus of claim 6 wherein said reference voltage supply is a variable voltage supply having a control input terminal that is biased to cause said reference voltage supply to produce said constant reference voltage.

8. The apparatus of claim 6 wherein said first current sink is an active circuit containing at least one transistor.

9. The apparatus of claim 8 wherein said second current sink is an active circuit containing at least one transistor.

10. The apparatus of claim 8 further comprising a mode control circuit to enable the output voltage of the power supply to track a voltage, a current or be a fixed value.

11. The apparatus of claim 8 wherein said power supply further comprises a current monitoring circuit for producing a current monitoring signal that is indicative of a leakage current flowing into said electrostatic chuck from said power supply, where said output voltage is altered to maintain a constant leakage current.

12. The apparatus of claim 8 wherein said power supply further comprises a voltage monitoring circuit for producing a voltage feedback signal for the variable voltage supply and the reference voltage supply to maintain power supply stability.

13. The apparatus of claim 8 wherein said power supply further comprises a plasma detection circuit for disabling a current tracking mode when said plasma is not detected.

14. The apparatus of claim 13 wherein said plasma detection circuit detects the magnitude of the chucking indicator value to determine plasma existence.

15. The apparatus of claim 14 wherein said plasma detection circuit causes said power supply to apply a dechucking voltage to said electrostatic chuck upon measuring a chucking indicator value representing a wafer bias voltage that is less than a predefined voltage.

16. A method for retaining a substrate in a semiconductor processing system, comprising the steps of:
   supporting the substrate on a substrate support surface of an electrostatic chuck containing a chucking electrode;
   applying a variable DC chucking voltage between said chucking electrode and the substrate to produce a potential difference to electrostatically retain the substrate;
   measuring a peak-to-peak or peak voltage of a signal used to generate a plasma in said semiconductor processing system and for generating a chucking indicator value from said peak-to-peak or peak voltage; and
   dynamically maintaining said potential difference at a predefined value in response to said chucking indicator value.

17. The method of claim 16 wherein said peak-to-peak or peak voltage is an RF voltage applied to a cathode electrode within a process chamber by an RF supply.

18. The method of claim 17 wherein said maintaining step further comprises the step of selecting an operating mode to enable the variable DC chucking voltage to track current or voltage.

19. The method of claim 18 wherein said maintaining step further comprises the step of detecting the existence of a plasma proximate the substrate and, if the plasma is not detected, said selected operating mode enables the variable DC chucking voltage to track voltage or have a fixed value.

20. The method of claim 19 further comprising detecting a plasma intensity and applying a dechucking voltage when said plasma intensity is less than a predefined level.

21. Apparatus for retaining a substrate, in a semiconductor processing system comprising:
   an electrostatic chuck having an electrode embedded beneath a substrate support surface;
   a power supply, coupled to said electrode of said electrostatic chuck, for applying a variable chucking voltage to said electrode, where said substrate is retained by a potential difference between said substrate and said electrostatic chuck;
   a monitoring circuit, coupled to said electrostatic chuck, for measuring a leakage current that flows into said electrostatic chuck to form a chucking indicator value; and
   a controller, coupled to said power supply and said monitoring circuit, for dynamically maintaining said leakage current at a predefined, non-zero value in response to said chucking indicator value.

22. The apparatus of claim 21 wherein said variable chucking voltage has a voltage range which is positive and negative.

23. The apparatus of claim 21 wherein said power supply can both source and sink current.

24. The apparatus of claim 21 wherein said power supply further comprises:
   a reference voltage supply having a constant reference voltage output that is referenced to ground;
   a variable voltage supply having a variable voltage output with reference to said constant reference voltage, where an output voltage of the variable voltage supply with reference to ground being the variable chucking voltage, the output voltage has a first output voltage limit equal to the constant reference voltage output voltage and a second output voltage limit equal to a maximum variable voltage available from the variable voltage supply less the constant reference voltage output;
   a first current sink, coupled to the reference voltage supply, for drawing a constant current from said reference voltage supply; and
   a second current sink, coupled to the variable voltage supply, for drawing a constant current from said variable voltage supply.

25. The apparatus of claim 24 wherein said reference voltage supply is a variable voltage supply having a control input terminal that is biased to cause said reference voltage supply to produce said constant reference voltage.

26. The apparatus of claim 24 wherein said first current sink is an active circuit containing at least one transistor.

27. The apparatus of claim 26 wherein said second current sink is an active circuit containing at least one transistor.

28. The apparatus of claim 24 further comprising a mode control circuit to enable the output voltage of the power supply to track a voltage, a current or be a fixed value.

29. The apparatus of claim 24 wherein said power supply further comprises a voltage monitoring circuit for producing a voltage feedback signal for the variable voltage supply and the reference voltage supply to maintain power supply stability.

30. The apparatus of claim 24 wherein said power supply further comprises a plasma detection circuit for disabling a current tracking mode when said plasma is not detected.

31. A method for retaining a substrate, comprising the steps of:
   supporting the substrate on a substrate support surface of an electrostatic chuck containing a chucking electrode;
   applying a variable DC chucking voltage between said chucking electrode and the substrate to produce a potential difference to electrostatically retain the substrate;
   measuring a leakage current that flows into said electrostatic chuck to form a chucking indicator value; and
   dynamically maintaining said leakage current at a predefined, non-zero value in response to said chucking indicator value.

32. The method of claim 31 wherein said maintaining step further comprises the step of selecting an operating mode to enable the variable DC chucking voltage to track current or voltage.

* * * * *

UNITED STATES PATENT AND TRADEMARK OFFICE
CERTIFICATE OF CORRECTION

PATENT NO.    : 6,198,616 B1
DATED         : March 6, 2001
INVENTOR(S)   : Dahimene, et al.

It is certified that error appears in the above-identified patent and that said Letters Patent is hereby corrected as shown below:

Column 5,
Line 1, insert the following paragraph: -- FIG. 3 depicts the proper alignment of FIGS. 3A-3J; --
Line 1 (now line 2), delete "FIG 3A-3C", insert in place thereof -- FIGS. 3A-3J --.

Column 8,
Line 62, delete "diagram of FIG. 3A below", insert in place thereof -- diagrams of FIGS. 3A-3J below --.

Column 12,
Lines 44-45, delete "3A, 3B and 3C", insert in place thereof: -- 3A-3J --.
Line 50, delete "FIG. 3A depicts", insert in place thereof -- FIGS. 3I, 3J and portions of FIGS. 3E, 3F and 3G depict --.

Column 13,
Line 15, delete the sentence stating with "The scaled" and ending with "(to FIG. 3C)".
Line 34, delete "3B", insert in place thereof: -- 3F --.

Column 14,
Lines 1 and 2, delete the sentence starting with "Points B" and ending with FIG. 3C"; after "Continuing", delete "to FIG. 3B", insert in place thereof -- with FIG. 3E --.
Line 24, delete "D".
Line 25, delete "FIG. 3C, insert in place thereof: -- FIGS. 3D and 3H --.
Line 39, delete "3C", insert in place thereof: -- 3G --.

Column 15,
Line 39, delete "3C", insert in place thereof: -- 3G --.

Column 16,
Lines 3 and 4, delete "at point B. This signal", insert in place thereof -- that --.
Line 8, delete "at point A".
Line 10, delete "from point J".
Line 16, delete the entire paragraph starting with "The signals from" and ending with "on point I".
Line 23, delete "(points E and F)".

UNITED STATES PATENT AND TRADEMARK OFFICE
CERTIFICATE OF CORRECTION

PATENT NO. : 6,198,616 B1
DATED : March 6, 2001
INVENTOR(S) : Dahimene, et al.

It is certified that error appears in the above-identified patent and that said Letters Patent is hereby corrected as shown below:

<u>Column 16,</u>
Line 33, delete "at point E".

<u>Column 17,</u>
Line 31, delete "on point C".

Signed and Sealed this

Sixteenth Day of October, 2001

*Attest:*

*Attesting Officer*

NICHOLAS P. GODICI
*Acting Director of the United States Patent and Trademark Office*